United States Patent [19]
Oyama et al.

[11] Patent Number: 5,253,256
[45] Date of Patent: Oct. 12, 1993

[54] ARRAY DISK APPARATUS WITH UNSUCCESSFUL RECONSTRUCTION INDICATING FUNCTION

[75] Inventors: Tomohisa Oyama, Sagamihara; Yumiko Ohizumi, Kawasaki, both of Japan

[73] Assignee: Fujitsu Limited, Kawasaki, Japan

[21] Appl. No.: 655,694

[22] Filed: Feb. 15, 1991

[30] Foreign Application Priority Data

Feb. 16, 1990 [JP] Japan ................................ 2-33930

[51] Int. Cl.⁵ .......................................... H03M 13/00
[52] U.S. Cl. .................................................. 371/40.1
[58] Field of Search ..................... 371/40.1, 40.2, 40.4, 371/10.1, 10.2, 11.1, 38.1, 37.4, 21.1; 365/200, 201

[56] References Cited

U.S. PATENT DOCUMENTS

| | | | |
|---|---|---|---|
| 3,742,459 | 6/1973 | Looschen | 371/40.1 |
| 4,682,305 | 7/1987 | Ishikawa | 364/900 |
| 4,775,978 | 10/1988 | Harness . | |
| 4,817,035 | 3/1989 | Timsit . | |
| 4,914,656 | 4/1990 | Dunphy, Jr. et al. | 371/10.2 |
| 4,989,205 | 1/1991 | Dunphy, Jr. et al. | 371/40.1 |
| 4,989,206 | 1/1991 | Dunphy, Jr. et al. | 371/40.4 |
| 5,077,736 | 12/1991 | Dunphy, Jr. et al. | 371/40.1 |

*Primary Examiner*—Robert W. Beausoliel, Jr.
*Assistant Examiner*—Phung Chung
*Attorney, Agent, or Firm*—Armstrong, Westerman, Hattori, McLeland & Naughton

[57] ABSTRACT

An array disk apparatus capable of identifying locations where data reconstruction has failed. The apparatus comprises a disk controller containing a data reconstructing unit, a "reconstruction unsuccessful" information generating unit and a "reconstruction unsuccessful" information storing unit. The data reconstructing unit reconstructs lost data based on the data from the magnetic disk units other than the failed and repaired unit and on parity data associated with the data. The "reconstruction unsuccessful" information generating unit generates "reconstruction unsuccessful" information if another magnetic disk unit develops a read error during a data reconstruction process. The "reconstruction unsuccessful" data storing unit stores the "reconstruction unsuccessful" information to the failed magnetic disk unit after the repair thereof.

7 Claims, 5 Drawing Sheets

ARRAY DISK APPARATUS WITH UNSUCCESSFUL RECONSTRUCTION INDICATING FUNCTION

BACKGROUND OF THE INVENTION

The present invention relates to an array disk apparatus wherein serial data is dividedly stored into a plurality of disk units from which the divided data is read and composed into the original serial data.

Recent developments in computer technology are phenomenal. Particularly impressive is the enhanced speed of processing by the CPU (central processing unit). The information processed by computer is generally stored in external storage devices. As information is processed by computer at speeds higher than ever before, there is a growing need for magnetic disk units that function as external storage devices to and from which information is stored and retrieved at correspondingly higher speeds. Although magnetic disk units working as external storage devices have relatively short access times, they are incapable of fully addressing the accelerated rates at which CPUs process their data. It is to fill the speed discrepancy between storage and processing that what is known as the array magnetic disk apparatus has been developed. A typical conventional magnetic disk apparatus uses a plurality of magnetic disk units (e.g., 8 units) to which data is dividedly stored. For data retrieval, the divided data is read from the multiple magnetic disk units and composed into the original data.

A conventional array disk apparatus comprises a plurality of magnetic disk units to which data is dividedly stored, a parity data magnetic disk unit to which the parity data associated with the dividedly stored data is stored, and a disk controller. The disk controller contains a data reconstructing unit that reconstructs data in a magnetic disk unit to and from which data cannot be written or read for some error, the reconstruction being carried out after repair of the error based on the data from the other magnetic disk units and from the parity data magnetic disk unit.

The array magnetic disk apparatus of the above construction divides data (e.g., 0, 1, 2, 3, ..., N, 2N, ...) into "n" (e.g., 8) pieces for storage into "n" magnetic disk units. The disk controller of the apparatus has its parity data generating unit which generates parity data "P1, P2 ..., Pn ..." for the divided data and places the parity data into the parity data magnetic disk unit. For data retrieval, the divided data is read simultaneously from the magnetic disk units and the associated parity data is read from the parity data magnetic disk unit. The retrieved data is reconstructed by the data reconstructing unit for output as serial data. If one magnetic disk unit develops an error and part or all of the data stored therein cannot be read therefrom, the data from the remaining magnetic disk units and the parity data from the parity data magnetic disk unit are used to reconstruct the affected data to be stored in the failed magnetic disk unit after the repair thereof.

One disadvantage of the above conventional array disk apparatus is that if another magnetic disk unit develops a read error while the repaired unit has its data being reconstructed, it is impossible to reconstruct data to be stored in the failed and repaired unit. In that case, the conventional array disk apparatus must be stopped halfway in its data reconstruction process and some appropriate action must be taken.

SUMMARY OF THE INVENTION

It is therefore an object of the present invention to provide an array disk apparatus whereby, if another magnetic disk unit develops a read error while the unit that recently failed and is now repaired has its data being reconstructed, the data reconstruction process is allowed to continue after a temporary process stoppage.

In accordance with an aspect of the present invention, there is provided an array disk apparatus for dividing serial data and storing the divided data into a plurality of disk units from which the divided data is read and composed into the original serial data, the apparatus comprising: means for dividing serial data into a plurality of divided data; a plurality of data disk units for storing the plurality of divided data, one unit accommodating one divided data item; means for generating parity data associated with the plurality of divided data; a parity data disk unit for storing the parity data; means for composing the plurality of divided data into the serial data; means which, if one of the plurality of data disk units develops an error and becomes incapable of storing data or of allowing part or all of the data stored therein to be read therefrom, reconstructs the affected data for storage into the failed data disk unit after the repair thereof; means which, if another data disk unit develops a read error during a data reconstruction process, generates "reconstruction unsuccessful" information indicating that the affected data cannot be reconstructed; and means for writing the "reconstruction unsuccessful" information to the data disk unit whose data is to be reconstructed.

Preferably, the data disk units are magnetic disk units and the "reconstruction unsuccessful" information is a flag illustratively written to an ID part of the failed magnetic disk unit.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 3 (B) is a view illustrating the state of data recording in which data has failed to be reconstructed with the embodiment;

FIG. 6 (B) is a view illustrating another example of data recording when data reconstruction has failed.

DESCRIPTION OF THE PREFERRED EMBODIMENTS

Figure 1:
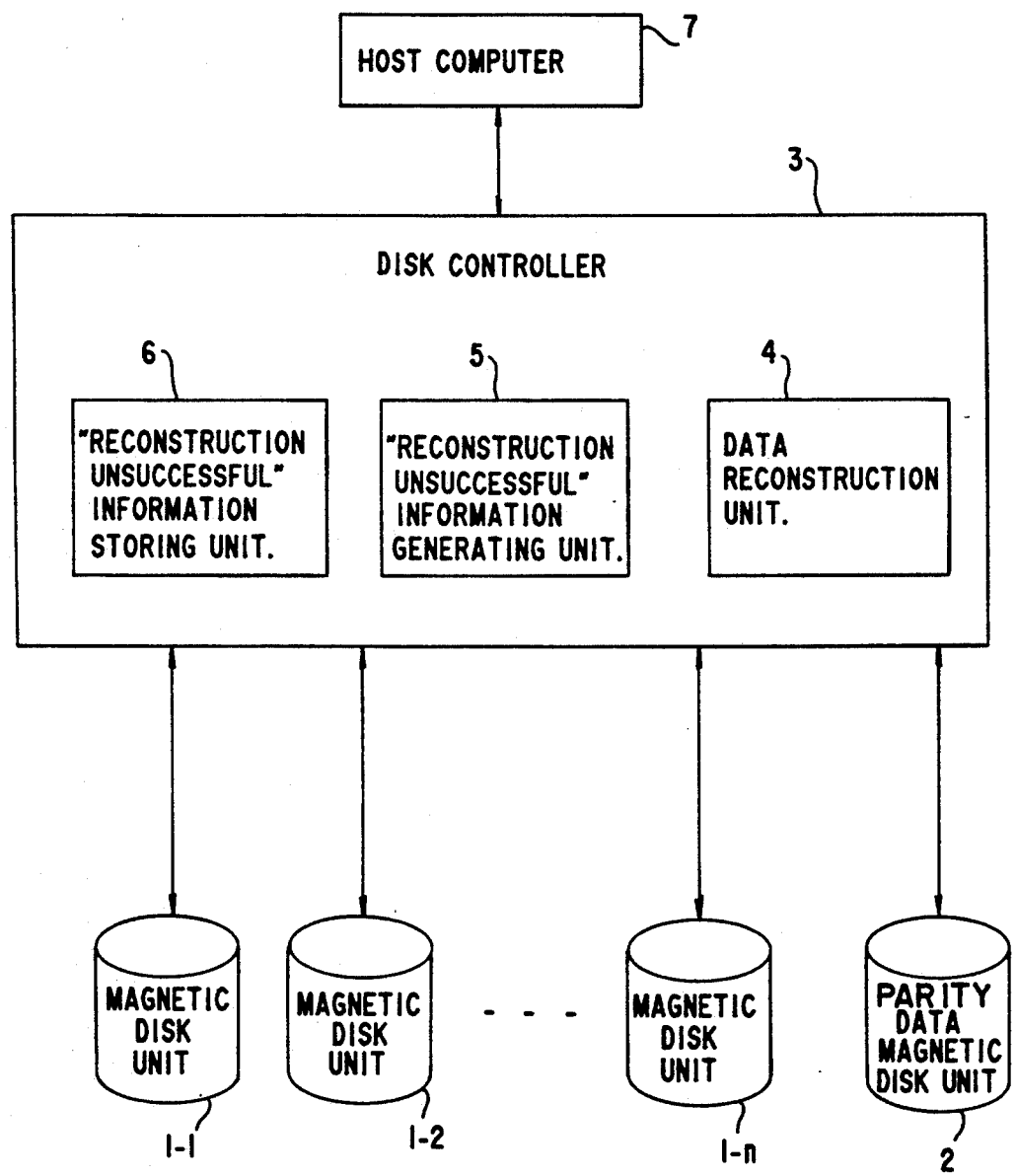
FIG. 1 is a block diagram of the construction of an array disk apparatus embodying the present invention.

Referring to FIG. 1, the array disk apparatus embodying the present invention comprises a plurality of magnetic disk units 1-1 through 1-n to which data is dividedly stored, a parity data magnetic disk unit 2 to which to store the parity data associated with the dividedly stored data, and a disk controller 3 for controlling the magnetic disk units 1-1 through 1-n and the parity data magnetic disk unit 2. The disk controller 3 includes a data dividing unit and a data composing unit, both not shown, the data dividing unit evenly dividing the serial data from a host computer 7 for transfer to and storage in each magnetic disk unit, the data composing unit composing the data from each magnetic disk unit into the original serial data.

The disk controller 3 further includes a data reconstructing unit 4, a "reconstruction unsuccessful" information generating unit 5 and a "reconstruction unsuccessful" information storing unit 6. Where data cannot be read from one magnetic disk unit for some error, the data reconstructing unit 4 reconstructs the data to be stored in the failed unit based on the data from the other magnetic disk units and on the parity data from the parity data magnetic disk unit. If another magnetic disk unit develops a read error while the repaired erroneous magnetic disk unit has its data being reconstructed, the "reconstruction unsuccessful" information generating unit 5 generates information saying that data reconstruction is unsuccessful. The "reconstruction unsuccessful" information storing unit 6 stores the "reconstruction unsuccessful" information to the magnetic disk unit whose data is to be reconstructed.

Figure 2:
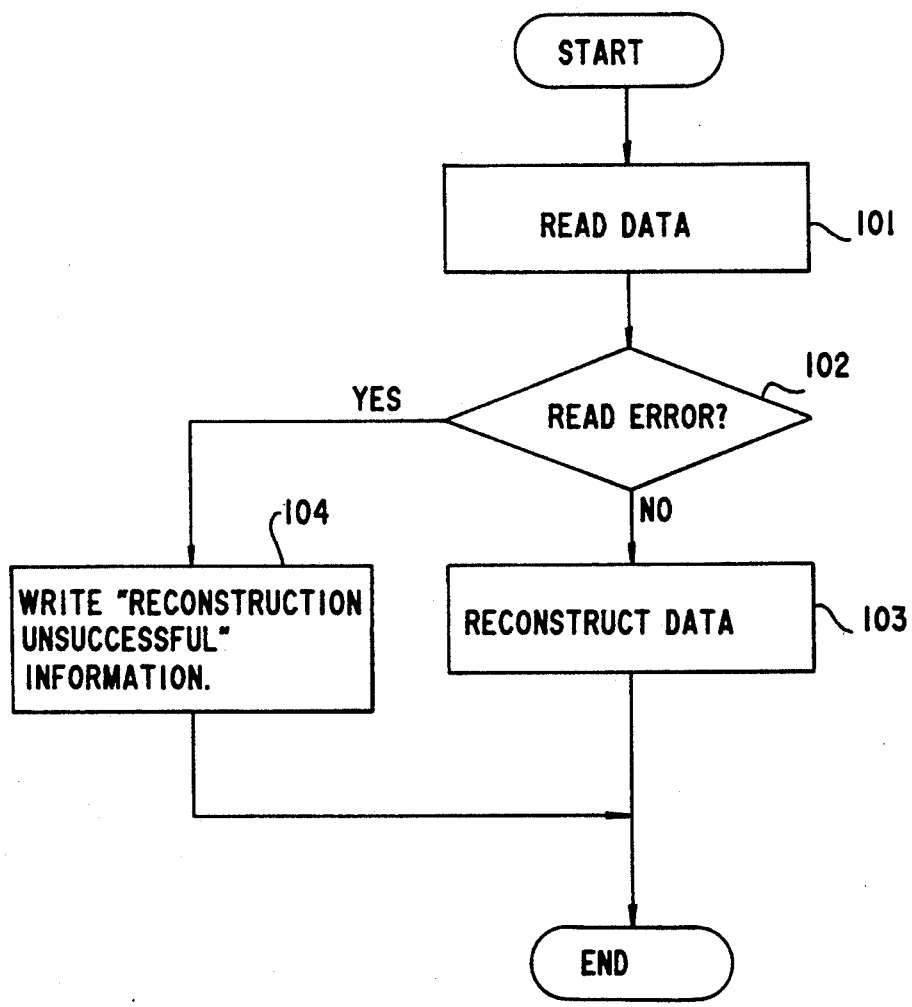
FIG. 2 is a flowchart showing how the embodiment works.

How the embodiment of the above construction works will now be described with reference to FIG. 2. In step 101, in order to reconstruct the data to be stored in a failed magnetic disk unit, the data stored in the other magnetic disk units is read therefrom and the associated parity data is read from the parity data magnetic disk unit after the failed magnetic disk unit is repaired. In step 102, a check is made to see if a read error exists in any magnetic disk unit. With no read error detected, step 103 is reached in which the appropriate data is reconstructed in the repaired magnetic disk unit.

If a read error is detected in step 102 in a magnetic disk unit other than the unit whose data is to be reconstructed, data reconstruction becomes unavailable. In that case, the "reconstruction unsuccessful" information generating unit 5 in the disk controller 3 generates "reconstruction unsuccessful" information. In step 104, the "reconstruction unsuccessful" information storing unit 6 writes the "reconstruction unsuccessful" information to the magnetic disk unit whose data is to be reconstructed.

Figure 3A:
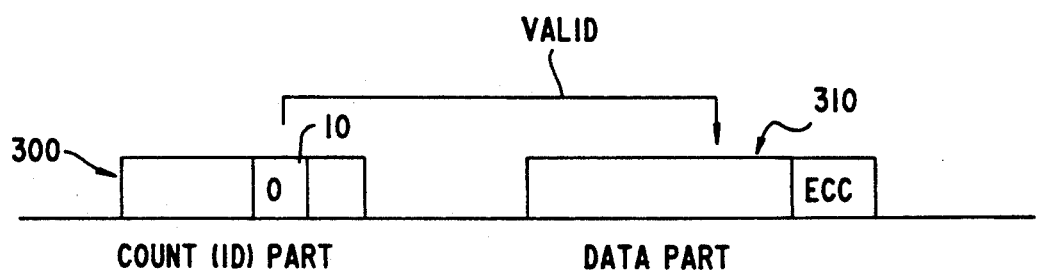
FIG. 3 (A) is a view depicting the state in which data is normally reconstructed with the embodiment.
Figure 3B:
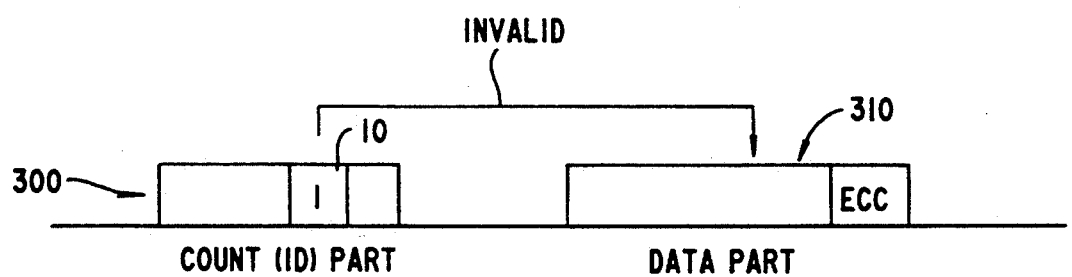

As shown in FIG. 3 (B), the embodiment has a data part 310, and an indicator 10 provided in a count part (ID part) 300 of each record block. If data reconstruction becomes unsuccessful, a flag "1" is set in the indicator 10, thus identifying the location where the data cannot be reconstructed. FIG. 3 (A) shows the state in which data is normally recorded. In this state, a "0" is written to the indicator 10.

After the "reconstruction unsuccessful" information is written to the magnetic disk unit whose data is to be reconstructed, the interrupted data reconstruction process may be resumed. Under the above control scheme, access to the count part upon data retrieval indicates that the portion where the flag "1" is set has unsuccessful data reconstruction. In this manner, it is possible to identify any location where data is not normally recorded.

Figure 4:
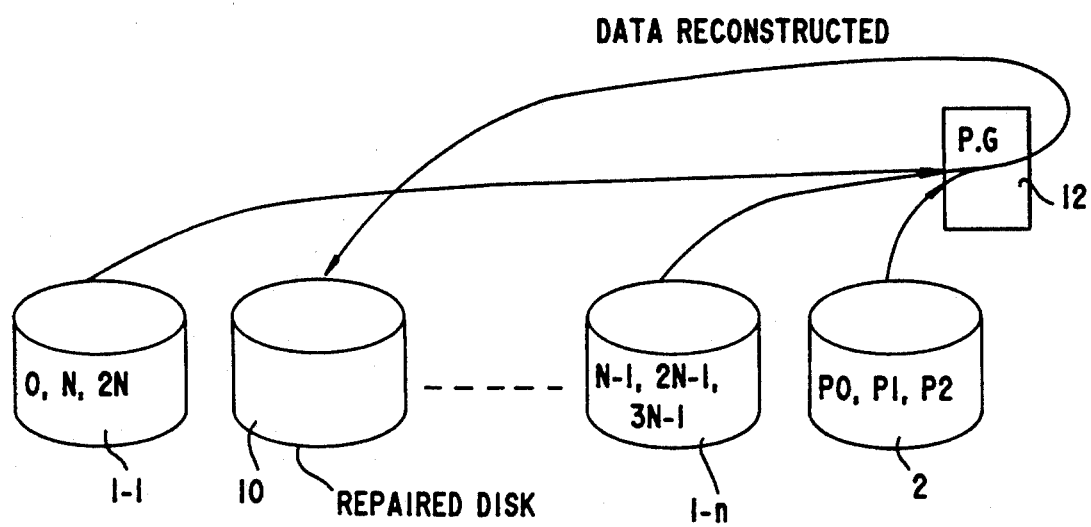
FIG. 4 is a schematic diagram showing how data is reconstructed by the embodiment.
Figure 5:
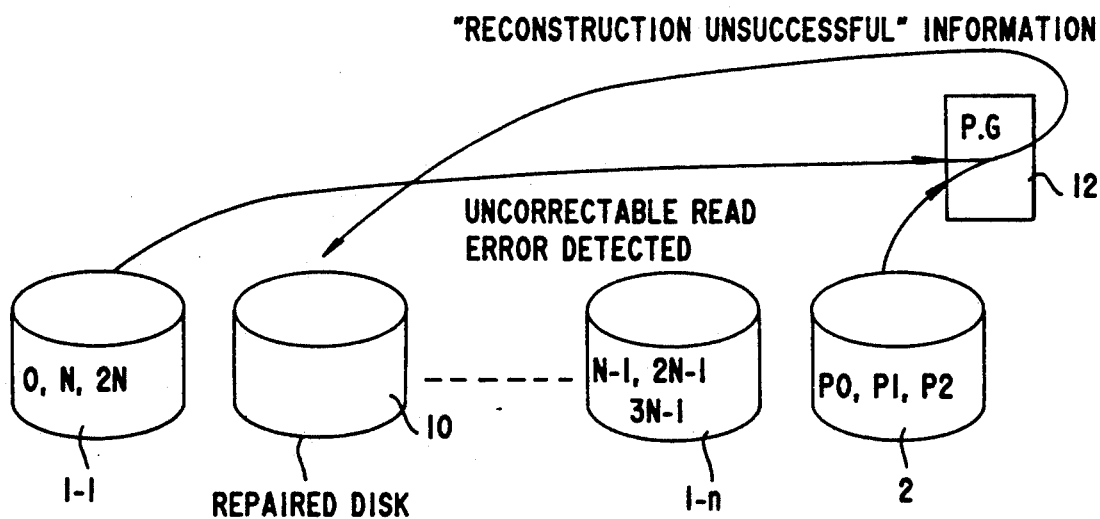
FIG. 5 is a schematic diagram indicating how the embodiment writes "reconstruction unsuccessful" information.

FIG. 4 schematically illustrates how data is reconstructed. In FIG. 4, data is reconstructed by reading divided data sections stored in the magnetic disk units 1-1 and 1-n and parity data stored in the parity data magnetic disk unit 2 through parity generator (P.G.) 12 provided in the disk controller, and reconstructed data is written into the repaired disk unit 10. FIG. 5 provides a schematic view of "reconstruction unsuccessful" information being written to a repaired magnetic disk unit. In FIG. 5, if read error is detected in the magentic disk unit 1-n while data is being reconstructed, reconstruction unsuccessful information is generated and written into the repair disk unit 10.

Figure 6A:
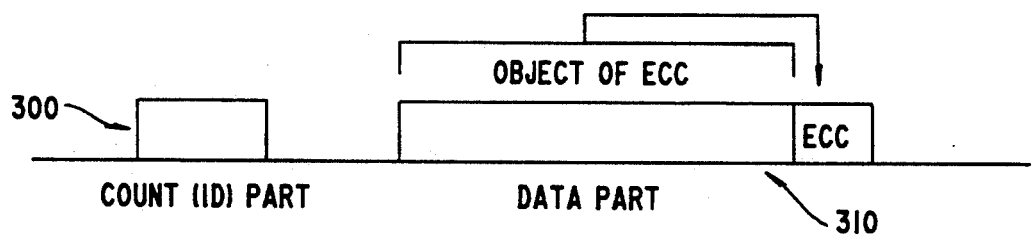
FIG. 6 (A) is a view indicating the state in which data is normally reconstructed.
Figure 6B:
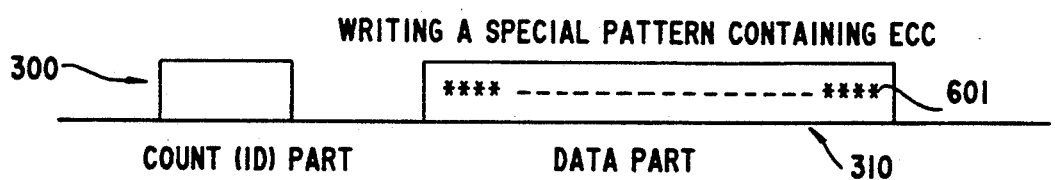

In the above-described embodiment, the use of "reconstruction unsuccessful" information involves providing the indicator 10 in the count part for identification purposes. Alternatively, a special pattern containing an error check code (ECC) 601 may be written to the data part for identification, as depicted in FIG. 6 (B). FIG. 6 (A) shows the state in which data is normally recorded. When read error is detected while data is being reconstructed, reconstruction unsuccessful information is written into the data part of the repaired disk unit. The reconstruction unsuccessful information comprises a special binary pattern containing error check code.

The location to which to write the "reconstruction unsuccessful" information is not limited to the count part or data part; the information may be written to any other appropriate location. Furthermore, the disks on which to store data are not limited to magnetic disks; these disks may be optical disks or any other suitable external storage means.

As described and according to the invention, if another magnetic disk unit develops a read error while the failed magnetic disk unit has its data being reconstructed, "reconstruction unsuccessful" information is generated and written to the magnetic disk unit under data reconstruction. This makes it possible to resume the data reconstruction process that was interrupted after the "reconstruction unsuccessful" information was recorded. Upon data retrieval with this embodiment, reading the "reconstruction unsuccessful" information allows the location where data is not normally recorded to be precisely identified.

It is to be understood that while the invention has been described in conjunction with specified embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. An array disk apparatus comprising:
   means for dividing serial data into a plurality of divided data sections;
   a plurality of data disk units for storing said plurality of divided data sections, each data disk unit accommodating a respective divided data section;
   means for generating parity data for said plurality of divided data sections;
   a parity data disk unit for storing said parity data;
   means for composing said plurality of divided data sections into said serial data;
   means for reconstructing a first data section of said plurality of divided data sections when a first one of said plurality of data disk units develops an error and becomes inoperable at least in part;

means for storing said reconstructed first data section into said first inoperable data disk unit after a repair thereof;

means for generating information indicating unsuccessful reconstruction of a part of said first data section of said plurality of divided data sections when a second data disk unit becomes inoperable at least in part during said reconstruction of said first data section; and means for writing said information indicating unsuccessful reconstruction of a part of said first data section to said first inoperable data disk unit during data reconstruction of said first data section.

2. An array disk apparatus according to claim 1, wherein said plurality of data disk units are a plurality of magnetic disk units and wherein said information indicating unsuccessful reconstruction of a part of said first data section is a flag written to an identification part of said first inoperable data disk units.

3. A array disk apparatus according to claim 1, wherein said plurality of data disk units are a plurality of magnetic disk units and wherein said information indicating unsuccessful reconstruction of a part of said first data section is a pattern written to a data part containing an in said first inoperable data disk unit.

4. An array disk apparatus according to claim 1, wherein said first inoperable data disk unit is incapable of storing data therein.

5. An array disk apparatus according to claim 1, wherein said first inoperable data disk unit is incapable of having data stored thereon read therefrom at least in part.

6. An array disk apparatus according to claim 1, wherein said means for reconstructing said first data section comprises means for reading other data sections of said plurality of divided data sections from respective data disk units, and means for reading parity data from said parity data disk unit.

7. An array disk apparatus according to claim 1, wherein said plurality of data disk units are a plurality of optical disk units.

* * * * *